United States Patent [19]
Watters et al.

[11] Patent Number: 5,841,718
[45] Date of Patent: Nov. 24, 1998

[54] USE OF VOLTAGE EQUALIZATION IN SIGNAL-SENSING CIRCUITS

[75] Inventors: Lynne Watters, Sunnyvale; Sharlin Fang, San Jose; Pochung Young, Fremont, all of Calif.

[73] Assignee: Mosel Vitelic, Inc., Taiwan, China

[21] Appl. No.: 909,014

[22] Filed: Aug. 8, 1997

[51] Int. Cl.[6] .................................................. G11C 7/00
[52] U.S. Cl. ............... 365/208; 365/189.05; 365/189.07; 365/202; 365/203
[58] Field of Search .................................. 365/202, 203, 365/189.05, 189.07, 208

[56] References Cited

U.S. PATENT DOCUMENTS

| | | | |
|---|---|---|---|
| 5,325,335 | 6/1994 | Ang et al. | 365/205 |
| 5,668,765 | 9/1997 | Ang | 365/208 X |
| 5,671,187 | 9/1997 | Childers et al. | 365/208 X |
| 5,694,363 | 12/1997 | Calligaro et al. | 365/208 X |

*Primary Examiner*—Do Hyun Yoo
*Attorney, Agent, or Firm*—Skjerven, Morrill, MacPherson, Franklin & Friel LLP; Michael Shenker

[57] ABSTRACT

A circuit provides a differential voltage on two nodes. The nodes are precharged by a precharge circuit before every cycle in which the differential voltage is provided. If during the precharge operation, the node voltage at one of the two nodes is within a predetermined range of voltages relative to a supply voltage used in the precharge operation, then the precharge circuit is incapable of precharging the two nodes to the same voltage, Therefore, an equalization transistor is provides between the two nodes to ensure that the two nodes are properly precharged and equalized by the end of the precharge operation.

28 Claims, 5 Drawing Sheets

USE OF VOLTAGE EQUALIZATION IN SIGNAL-SENSING CIRCUITS

BACKGROUND

1. Field of the Invention

The invention relates to signal-sensing circuits.

2. Description of Related Art

One example of a signal-sensing circuit is shown in FIG. 1. This circuit is an input buffer used in Dynamic Random Access Memory (DRAM) devices. The buffer converts an incoming TTL row address signal into corresponding supply voltage levels used inside the device.

The circuit includes four section. The "input" section comprises NMOS transistor M10 and M11. The gate of transistor M10 receives the TTL input signal IN (row address signal) on lead 11. The drain of transistor M10 is connected to node 14 and its source is connected to ground terminal 10 (VSS). The gate of transistor M11 receives reference voltage VREF on lean 12. The drawing of transistor M11 is connected to node 13 and its source is connected to VSS.

The "sense enable" section comprises NMOS transistor M8 and M9. The gates of transistors M8 and M9 receive the Sense Enable signal SE on lead 18. The drain of transistor M8 is connected to node B, and its source is connected to node 14. The drawing of transistor M9 is connected to node A, and its source is connected to node 13.

The "latch" section comprised transistors M2, M4, M6 and M7. The four transistors form two cross coupled CMOS inverters, one inverter consisting of transistors M2 and M6 and the other inverter consisting of transistors M4 and M7. The inverter consisting of transistors M2 and M6 has its input terminal connected to node 16 (OUT lead) and its output terminal connected to node 17 ($\overline{OUT}$ lead.) Unlike conventional inverters which are connected between a power supply terminal and a ground terminal, this inverter is connected between a power supply terminal 20 (VCC) and an internal node, node B. The inverter consisting of transistors M4 and M7 has its input terminal connected to node 17 and its output terminal connected to node 16. Similarly, this inverter is connected between VCC and the internal node A. Nodes 16 and 17 provide the output leads of the buffer.

The "precharge" section comprises PMOS transistors M1, M3 and M5. These three transistors precharge and equalize the voltage on leads OUT and $\overline{OUT}$. The gates of these transistors receive that Precharge signal PC on leads 15. The drain of transistor M1 is connected to the $\overline{OUT}$ lead, and its source is connected to VCC. The drain of transistor M5 is connected to the OUT lead, and its source is connected to VCC. The drain and source of transistor M3 are connected respectively to leads OUT and $\overline{OUT}$. Transistors M1 and M5 precharge the OUT and $\overline{OUT}$ leads to VCC, and transistor M3 equalizes the voltages at the OUT and $\overline{OUT}$ leads.

The buffer of FIG. 1 operates as follows. TTL signal IN is compared with the reference voltage VREF provided by a reference voltage generator (not shown.) VREF is mid-level between TTL high and TTL low voltage levels. For example, in VCC=5 V device where the TTL high voltage level is defined as being greater than or equal to 2.4 V, and the TTL low voltage level is defined as being less than or equal to 0.8 V, VREF is set to 1.6 V. If the IN signal voltage is greater than VREF, the output leads OUT and $\overline{OUT}$ are driven respectively to VCC and VSS. If the IN signal voltage is smaller that VREF, the output leads OUT and $\overline{OUT}$ are driven respectively to VSS and VCC.

FIG. 2 illustrates timing for the row address buffer of FIG. 1 for two access cycles shown as "cycle 1" and "cycle 2". Each of these cycles can be read or write. In cycle 1, the IN signal is a low TTL signal, and in cycle 2, the IN signal is a high TTL signal. Cycle 1 starts at a time $t_0$ when an externally supplied Row Address Select signal $\overline{RAS}$ is asserted low. Prior to time $t_0$, signal SE is low, and hence transistors M8 and M9 are off. As a result, nodes A and B are isolated from respective nodes 13 and 14, and the current paths from VCC to VSS are shut off. Thus, no static current is consumed by the circuit.

Prior to time $t_0$, the PC signal is low, and hence PMOS transistors M1, M3 and M5 are on. As a result, leads OUT and $\overline{OUT}$ are precharged and equalized to VCC, which is 5 V. Hence, NMOS transistors M6 and M7 are on. With the gates and drains of transistors M6 and M7 at 5 V, their sources (nodes B and A, respectively) are biased to one threshold voltage below 5 V. Assuming that the threshold voltages of transistors M6 and M7 are approximately 1 V, nodes A and B are at 4 V.

At about the time $t_o$, row address IN becomes valid to select a row of memory cells (not shown.) Transistor M10 may be either on or off depending on its threshold voltage and the low TTL voltage on signal IN. For example, if the IN voltage is 0.8 V, transistor M10 will be off if its threshold voltage is greater than 0.8 V, and will be on if its threshold voltage is less than 0.8 V. FIG. 2 shows the case wherein transistor M10 is off during cycle 1.

The PC and SE signals are generated internally from $\overline{RAS}$. At the beginning of cycle 1, a short time after the $\overline{RAS}$ signal is asserted low at time $t_o$, the PC signal goes high at time $t_1$. Therefore, a precharge transistors M1, M3, and M5 turn off. As a result, the OUT and $\overline{OUT}$ leads float at 5 V, maintaining nodes A and B at 4 V.

At a time $t_2$ shortly after $t_1$, the SE signal goes high turning on transistors M8 and M9. With the gate to source voltage of transistor M11 being 1.6 V, this transistor is on while transistor M10, as mentioned above, is assumed to be off. As soon as transistors M8 and M9 turn on, node A is pulled down to 0 V, while node B remains at 4.0 V. With 5 V at the gates of transistors M6 and M7, the voltage at the OUT lead follows node A and is pulled low to 0 V, and the voltage at the $\overline{OUT}$ lead remains at 5V.

The operation in the case of transistor M10 being on is slightly different, although the outcome is the same. With the IN signal at a TTL low voltage level and VREF at 1.6 V, transistor M11 is on more strongly than transistor M10. Therefore, node A and the OUT lead are pulled low at a faster rate than node B and the $\overline{OUT}$ lead. As a result, the latch action forces the OUT lead low and the $\overline{OUT}$ lead high, similar to the case wherein transistor M10 is off. Node B however, continues to discharge since transistor M6 is off and both transistors M8 and M10 are on.

Whether node B is discharged during cycle 1 or not is insignificant since node B is precharged to 4.0 V at the end of cycle 1 when the PC signal goes low.

At the end of cycle 1, a short time after the $\overline{RAS}$ signal is driven high at a time $t_4$, the SE and PC signals go low at times $t_5$ and $t_6$, respectively. The PC transition occurs after or at about the same time as the SE transition so that transistors M8 and M9 turn off before precharge transistors M1, M3 and M5 turn on. This ensures that no transient current paths are created between VCC and VSS.

When transistors M8 and M9 are off, nodes A and B are isolated from respective nodes 13 and 14. Transistor M1 maintains the $\overline{OUT}$ lead at 5 V, while transistor M5 precharges the OUT lead from 0 V to VCC (5 V). The OUT lead rising to 5 V causes: (1) node A to rise to VCC-VT (4 V), and (2) transistor M6 to turn on which helps maintain nodes B at 4.0 V (or causes node B to rise to 4 V if node B was discharged.) Therefore, prior to the start of cycle 2, both nodes A and B are at 4 V.

At the beginning of cycle 2, the $\overline{RAS}$ signal is asserted low at time $t_7$. The $\overline{RAS}$ transition causes signals PC and SE to go high at times $t_8$ and $t_9$, respectively. Note that prior to the SE signal going high, the gates and drains of transistors M6 and M7 are at 5 V, and their sources are at 4 V. As a result, these two transistors are barely off, and if nodes A and B move slightly down, they turn off.

In cycle 2, transistor M10 is turned on stronger than transistor M11 since transistor M10 is driven by a TTL high level of 2.4 V or greater across its gate to source terminals as compared to 1.6 V across the gate to source terminals of transistor M11. Therefore, when transistors M8 and M9 turn on via signal SE at time $t_9$, node B is pulled low faster than node A. With nodes A and B going low, transistors M6 and M7 turn on, which cause the OUT and $\overline{out}$ leads to initially follow nodes A and B, respectively. But, with node B, and hence the $\overline{OUT}$ lead, falling faster than node A and the OUT lead, the latch will rapidly cause the OUT and $\overline{out}$ leads to be pulled respectively high and low.

The end of cycle 2 is not shown in FIG. 2, but is similar to the end of cycle 1, and therefore will not be described.

There is a need for improving this circuit.

SUMMARY

The inventors have discovered that the row address input buffer of FIG. 1 does not operate properly under certain conditions. It turns out that under some conditions, node B can not be precharged to the same voltage as node A during a precharge operation. This may cause the circuit to provide faulty data in a subsequent access cycle.

In accordance with the invention, an equalization transistor is provided between nodes A and B to equalize the voltages on the two nodes before each access cycle.

The invention is not limited to this improvement of the buffer of FIG. 1. Some embodiments include an input circuit C1, a precharge circuit C3, an equalization circuit C4, and a latch circuit C5. The input circuit C1 receives an input signal and provides a corresponding differential voltage on two nodes N1 and N2. Circuit C1 further includes a circuit C2 which isolates nodes N1 and N2 from the input signal in a precharge operation. The precharge circuit C3 is to precharge nodes N1 and N2 to a precharge voltage during the precharge operation. However, if the node voltage on at least one of nodes N1 and N2 is within a predetermined range of voltages relative to a voltage source used to precharge the nodes (e.g. relative to VCC) then circuit C3 is incapable of precharging that node to the precharge voltage. Yet, the equalization circuit C4 equalizes the voltages on nodes N1 and N2 by the end of the precharge operation. The latch circuit C5 latches the differential voltage on nodes N1 and N2 after the precharge operation.

This and other features of the invention will become more apparent from the following description and the accompanying drawings.

DESCRIPTION OF PREFERRED EMBODIMENTS

Figure 1:
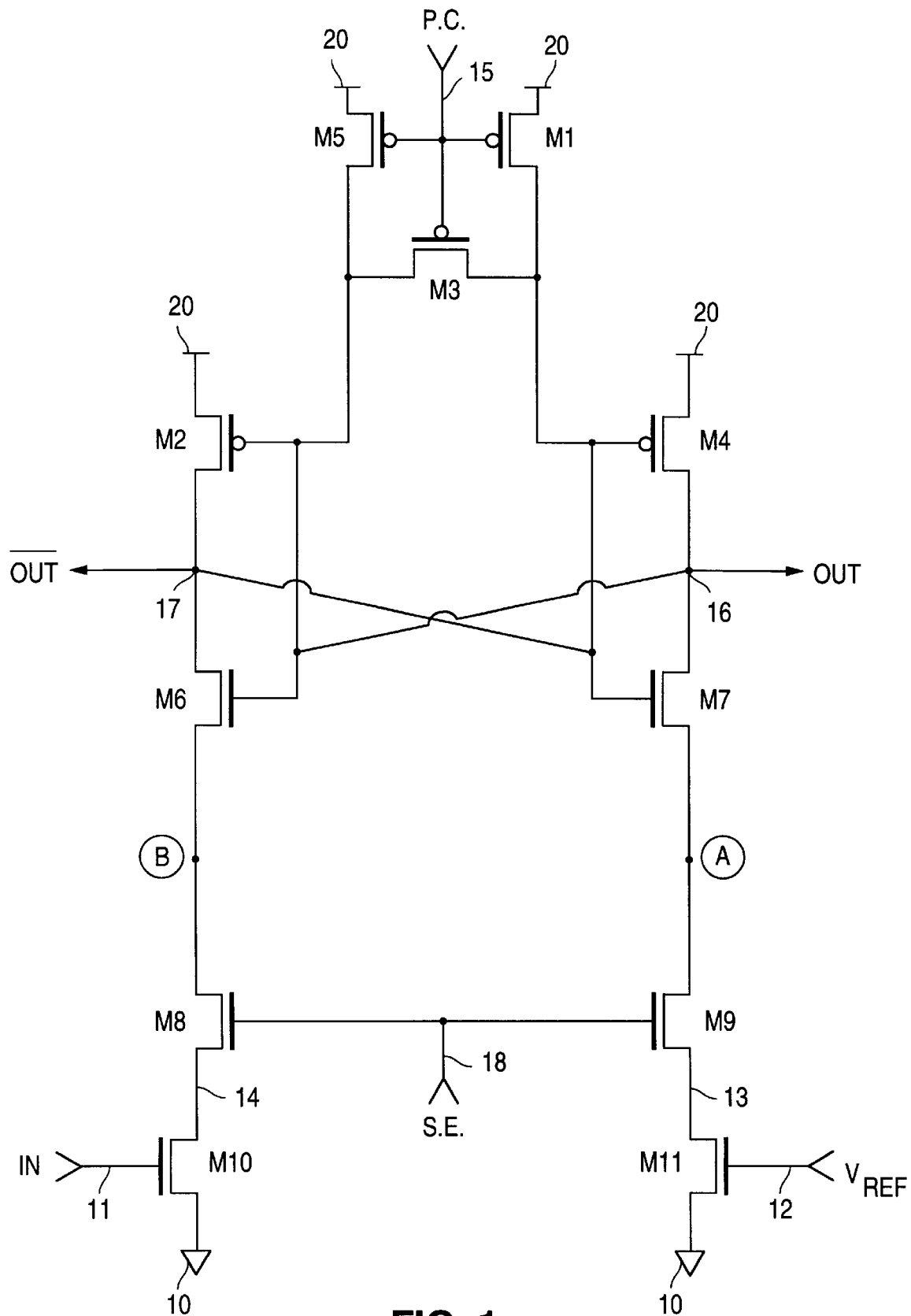
FIG. 1 is a circuit diagram of a prior art input buffer used in semiconductor memory devices.

The inventors have discovered that the circuit of FIG. 1 does not operate properly under certain conditions within the limits of typical DRAM device specification. One such set of conditions will be described next using the timing diagram of FIG. 3.

Figure 2:
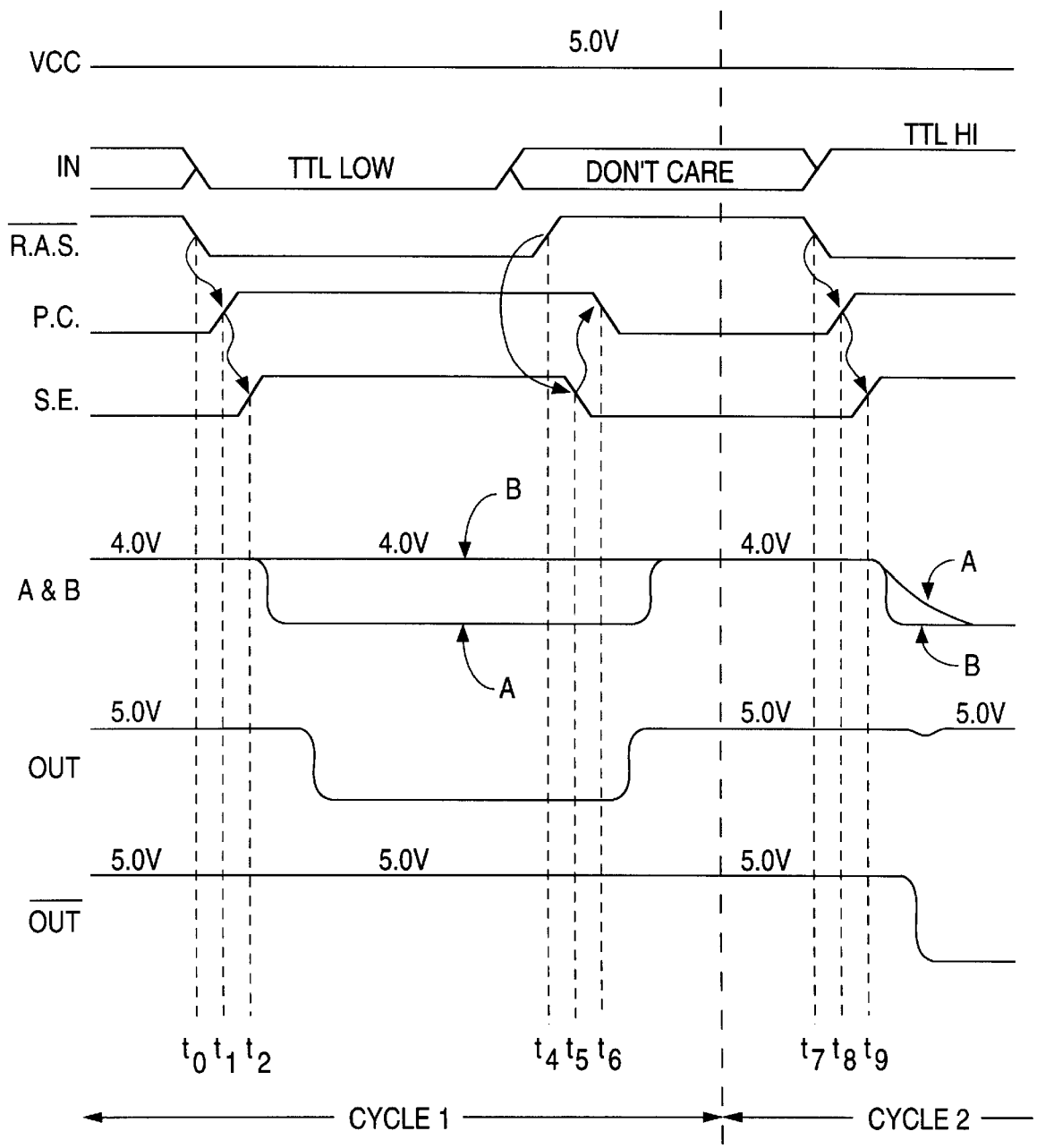
FIG. 2 is a timing diagram illustrating a normal (faultless) operation of the buffer of FIG. 1.
Figure 3:
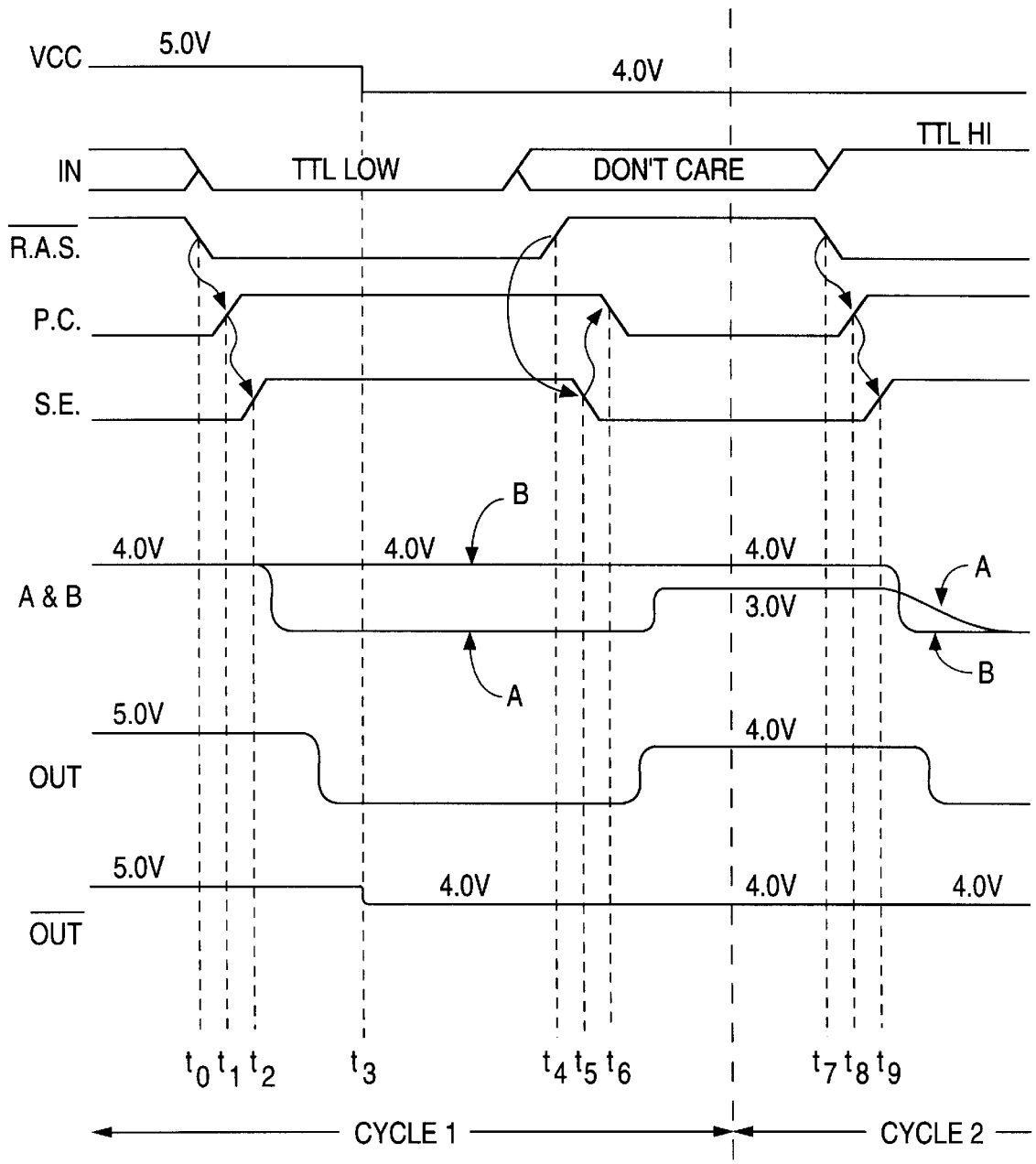
FIG. 3 is a timing diagram illustrating a faulty operation of circuit of FIG. 1.

The input signals IN, $\overline{RAS}$, PC and SE in FIG. 3 are like those in FIG. 2. However, the VCC voltage level changes from 5 V to 4 V in the middle of cycle 1 at a time $t_3$ between the times $t_2$ and $t_4$. Such change may occur, for example, due to current surges causing the power supply to drop for a period of time such as during cycling the device at the highest permitted frequency, or simply due to intentional changing of the supply voltage level. If the supply voltage drops but remains within the power supply range indicated in the device specification, the memory is required to operate properly.

FIG. 3 assumes that in cycle 1 transistor M10 is off when the signal IN is a TLL low voltage level.

Prior to time $t_3$, transistors M1, M3 and M5 are off, transistors M8 and M9 are on, the OUT and $\overline{OUT}$ leads are respectively at 0 V and 5 V, and node A is at 0 V. Node B remains at 4 V during the time the SE signal is high since transistor M10 is off during that time.

At time $t_3$, when VCC changes from 5 V to 4 V, the voltage on the $\overline{OUT}$ lead is lowered from 5 V to 4 V by the conductive transistor M2. Node B remains unaffected by the VCC change since transistor M6 is off.

At the end of cycle 1, when the PC signal goes low at time $t_6$, transistors M1, M3, and M5 turn on. Transistor M1 maintains the $\overline{OUT}$ lead at 4 V, while transistor M5 precharges the OUT lead from 0 V to VCC which is now 4 V. With the gate of transistor M7 at 4 V, the OUT lead rising to 4 V causes node A to rise to VCC-VT or 3 V. However, node B remains at 4 V because, with 4 V on the gate, drain and source of transistor M6, this transistor if off. Accordingly, prior to the start of cycle 2, node B is at 4 V while node A is a 3 V.

At the beginning of cycle 2, prior to the SE signal going high at time $t_9$, the gate and drain of transistor M7 are at 4 V and its source is at 3 V. Thus, the gate to source voltage of transistor M7 is approximately equal to its threshold voltage (i.e., $V_{GS}=V_T=1V$), and hence as soon as node A moves down transistor M7 turns on. In contrast, transistor M6 will not turn on until, and if, node B moves down by more the 1 V to increase the gate to source voltage of the transistor to and $V_T$ or 1 V. Thus, node B would need to move from 4 V to below 3 V to turn on transistor M6.

The gates of transistors M10 and M11 are driven respectively by a TTL high level of 2.4 V or greater and VREF voltage of 1.6 V. Therefore, transistor M10 is on more strongly than transistor M11. As a result, when transistors M8 and M9 are turned on due to the SE signal going high at time $t_9$, node B starts falling at a faster rate than node A. However, while transistor M7 turns on right away, transistor M6 remains off until mode B moves down by at least 1 V. Hence, the OUT lead is pulled low before transistor M6 is even turned on. As a result, the latch will drive the OUT and OUT leads to the faulty states of low and high, respectively. Hence, the memory array (not shown) will receive an incorrect row address.

Note that if during cycle 1, transistor M10 were on (i.e., the TTL low voltage level were greater than the threshold voltage of transistor M10,) and the voltage on node B were to drop to 3.0 V or below, then the buffer of FIG. 1 would provide the correct data on the OUT and OUT leads in cycle 2. This is because at the end of cycle 1 and PC signal goes low (at time $t_6$,) and nodes A and B would be pulled up to the same voltage (3 V) via the transistors M7 and M6, respectively.

Therefore, under the conditions wherein, (i) the input signal IN is TTL low level in a first access cycle and a TTL high level in a second access cycle, (ii) the VCC voltage drops in the first cycle, and (iii) the voltage at node B does not discharge sufficiently during the time the SE signal is high, the circuit of FIG. 1 provides faulty data on its output leads OUT and OUT in the second cycle.

There are other conditions under which the circuit of FIG. 1 provides faulty data. Any conditions causing nodes A and B to be at different voltages prior to the SE signal going high, may cause the circuit of FIG. 1 to provide faulty data. This may happen if the voltages at nodes A and B are changed due to dissimilar capacitive coupling to these nodes from power bus lines or other lines running near nodes A and B.

In some embodiments, lead 11 (signal IN) is also connected to a column address buffer (not shown). The input lead 11 receives a column address after a row address in the same access cycle, as known in the art. The column address is provided when a column address strobe signal CAS (not shown) is asserted. This happens sometime between the times $t_2$ and $t_4$. A TTL high column address may discharge node B and cause the row address buffer to operate properly in cycle 2. However, a TTL low column address will cause node B to remain at 4 V under the conditions of FIG. 3. Hence, the row address buffer will operate improperly. (Of note, in FIG. 2 and 3, signal IN stops affecting leads OUT and OUT as soon as they reach their final states of 0 V and 5 V. After that, signal IN becomes a "don't care" with respect to the buffer of FIG. 1, although signal IN is not a "don't care" with respect to the column address buffer.)

Figure 4:
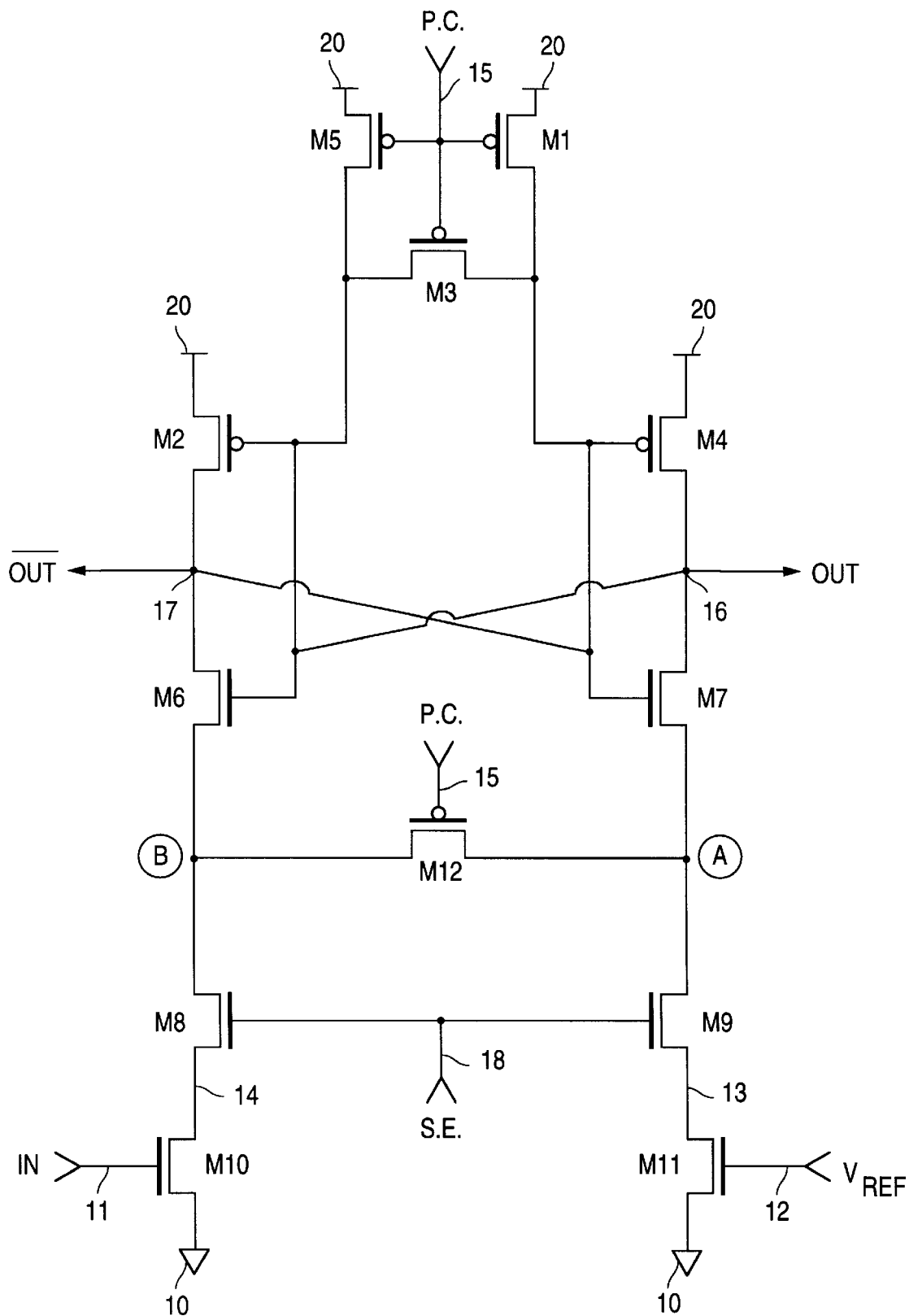
FIG. 4 is a circuit diagram of one embodiment of the present invention.

FIG. 4 shows an improved circuit. This circuit is identical to that of FIG. 1 except that a PMOS transistor M12 has been added. Transistor M12 has its gate connected to the PC signal on input lead 15, its drain connected to node A and its source connected to node B. This transistor equalizes nodes A and B when the PC signal is low.

Prior to the start of an access cycle, the PC signal is low causing nodes A and B to be equalized via transistor M12. At the beginning of a new access cycle, nodes A and B remain equalized until both PC and SE signals go high.

Figure 5:
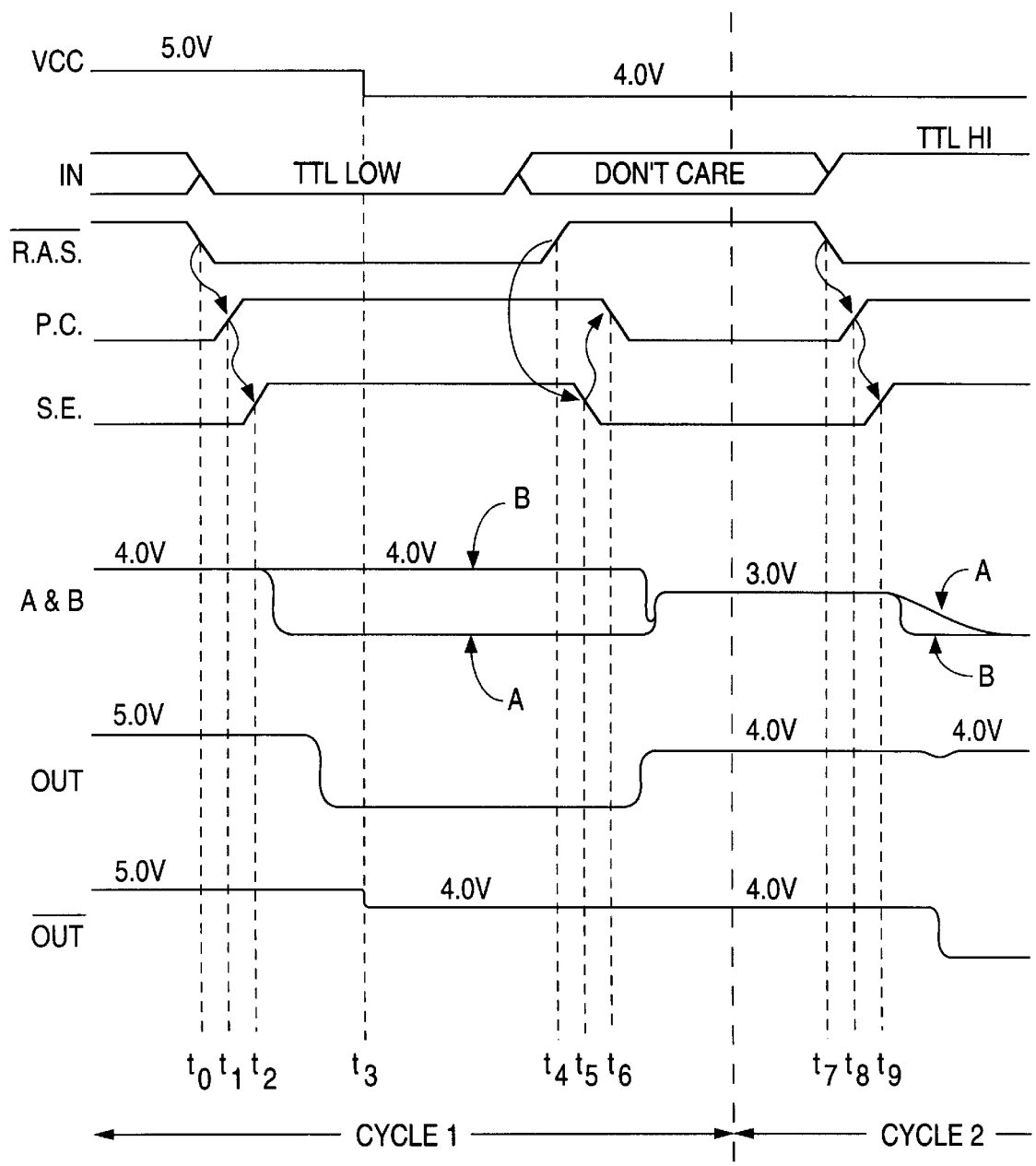
FIG. 5 is a timing diagram of the circuit of FIG. 4.

The operation of the circuit of FIG. 4 is illustrated by the timing diagram of FIG. 5. FIG. 5 assumes the same three conditions which cause the faulty operation illustrated in FIG. 3, namely: (i) the input signal IN is a TTL low level in cycle 1 and a TTL high level in cycle 2 (if lead 11 receives both row and column address signals, both signals are low in cycle 1), (ii) the VCC voltage drops in cycle 1, and (iii) during the time the SE signal is high in cycle 1, node B does not discharge to more than a threshold voltage of transistor M6 below the lowered VCC value.

In cycle 1 prior to time $t_6$, all the signals in FIG. 5 have the same levels as in FIG. 3. When the PC signal is high, transistor M12 is off and thus does not affect the circuit. However, when the PC signal goes low at time $t_6$, transistor M12 turns on along with transistors M1, M3, and M5. Transistor M12 causes node B to equalize with node A. Transistor M1 maintains the OUT lead at 4 V, while transistor M5 precharges the OUT lead from 0 V to 4 V. With the gate of transistor M7 (the OUT lead) at 4 V, the drain of transistor M7 (the OUT lead) rising to 4 V causes the source of transistor M7 (node A) and in turn node B to rise to VCC-VT of 3 V. Hence, nodes A and B are at the same voltage prior to the start of the next access cycle 2.

Cycle 2 proceeds as in FIG. 2 except that in FIG. 5 VCC equals 4.0 V in cycle 2 and the remaining signals are adjusted accordingly. As shown in FIG. 5, the buffer of FIG. 4 provides correct data in cycle 2.

The invention is not limited to address buffers of DRAMs. Some embodiments are used in other memories or in non-memory circuits. In some embodiments, VCC=3.3 V or some other value. The invention is not limited to TTL, CMOS, or any other voltage levels. While in FIG. 4 the nodes A and B are precharged from supply voltage VCC, some embodiments precharge nodes from a voltage that is different from a supply voltage. Other embodiments, variations and modifications are within the scope of the invention as defined by the appended claims.

What is claimed is:

1. In an integrated circuit which is to be powered by a power supply voltage, an input buffer for receiving a logic signal from a source external to the integrated circuit and converting the logic signal from a first voltage level to a second voltage level, the input buffer comprising:

an input circuit for receiving the logic signal from the external source and providing a corresponding differential voltage on a first and second nodes, the input circuit further comprising a sense enable circuit for isolating the first and second nodes from the logic signal in a precharge operation;

a first circuit for coupling the first and second nodes to the supply voltage during the precharge operation to charge the first and second nodes to a precharge voltage relative to the power supply voltage, wherein during the precharge operation if the node voltage at only one of the first and second nodes is within a predetermined range relative to the power supply voltage, then the first circuit does not couple said one of the nodes to the power supply voltage and is incapable of charging the first and second nodes to equal voltages during the precharge operation; and an equalization circuit for creating a conductive path between the first and second nodes only during the precharge operation to equalize the node voltages on the first and second nodes by an end of the precharge operation and a start of a voltage level conversion.

2. The circuit of claim 1 wherein the predetermined range includes the range between the precharge voltage and the supply voltage.

3. The circuit of claim 2, wherein:

the first circuit comprises a first NMOS transistor to charge the first node and a second NMOS transistor to charge the second node, during the precharge operation a precharge circuit supplies the supply voltage to gates and one of drains and sources of the first and second NMOS transistors, and the precharge voltage equals one threshold voltage below the supply voltage, the threshold voltage being that of the first and second NMOS transistors.

4. The circuit of claim 1 further comprising:
a latch circuit for latching the differential voltage on the first and second nodes; and
a precharge circuit for precharging a first and a second output terminals of the buffer circuit.

5. The circuit of claim 4 further comprising:
a power supply terminal for receiving the power supply voltage; and
a reference terminal for receiving a reference voltage, wherein;
the input circuit comprises a pair of transistors each of which is connected between the reference terminal and one of third and fourth nodes,
the sense enable circuit comprises a pair of transistors each of which is connected between one of the first and second nodes and one of the third and fourth nodes,
the equalization circuit comprises a transistor connected between the first and second nodes,
the latch circuit comprises a pair of cross coupled inverters each of which is connected between the power supply terminal and one of the first and second nodes, the latch circuit providing output signals on the first and second output terminals, and
the precharge circuit comprises a first, a second, and a third transistors, the first transistor being connected between the first and second output terminals and each of the second and third transistors being connected between the power supply terminal and one of the first and second output terminals.

6. The circuit of claim 5 wherein:
the pair of transistors in the input circuit and the pair of transistors in the sense enable circuit are NMOS transistors,
the first, second and third transistors in the precharge circuit and the transistor in the equalization circuit are PMOS transistors, and
the pair of inverters in the latch circuit are CMOS inverters.

7. The circuit of claim 1 wherein the input circuit provides the differential voltage by comparing the logic signal with a reference voltage.

8. The circuit of claim 7 wherein the logic signal is a TTL high voltage level or a TTL low voltage level, and the reference voltage is between the TTL high and TTL low voltage levels.

9. The circuit of claim 8 wherein the circuit is a Dynamic Random Access Memory (DRAM) and the logic signal is an address signal.

10. The circuit of claim 2 wherein the supply voltage is a positive supply voltage.

11. The circuit of claim 1 wherein the node voltage at said only one of the first and second nodes is caused to be within the predetermined range relative to the power supply voltage by a change in the power supply voltage.

12. The circuit of claim 3 wherein if prior to the precharge operation the node voltage at only one of the first and second nodes is at one threshold voltage below the supply voltage and the power supply voltage drops so that the NMOS transistor corresponding to said only one of the first and second nodes turns off, then the first and second nodes can not be charged to equal voltages during the precharge operation.

13. The circuit of claim 1 wherein the buffer circuit converts the logic signal to supply levels used inside the integrated circuit.

14. The circuit of claim 1 wherein the buffer circuit converts TTL voltage levels to CMOS voltage levels.

15. A method for converting a logic signal from a first voltage level to a second voltage level by an input buffer housed in an integrated circuit to be powered by a power supply voltage, the method comprising:
(A) in a precharge operation isolating a first and a second nodes from the logic signal received from a source external to the integrated circuit;
(B) coupling the first and second nodes to the supply voltage during the precharge operation to charge the first and second nodes to a precharge voltage relative to the supply voltage, wherein during the precharge operation if the node voltage at only one of the first and second nodes is within a predetermined range relative to the power supply voltage, then said one of the nodes can not be coupled to the power supply voltage and the first and second nodes can not be charged to equal voltages;
(C) creating a conductive path between the first and second nodes only during the precharge operation to equalize the node voltages on the first and second nodes by an end of the precharge operation; and
(D) providing a differential voltage on the first and second nodes after the precharge operation and at a start of a voltage level conversion, the differential voltage corresponding to the logic signal.

16. The method of claim 15 wherein the predetermined range includes the range between the precharge voltage and the supply voltage.

17. The method of claim 16 wherein:
the coupling of the first and second nodes to the supply voltage in step (B) is carried out by a circuit comprising a first NMOS transistor for charging the first node and a second NMOS transistor for charging the second node,
during the precharge operation a precharge circuit supplies the supply voltage to gates and one of drains and sources of the first and second NMOS transistors, and
the precharge voltage equals one threshold voltage below the supply voltages, the threshold voltage being that of the first and second NMOS transistors.

18. The method of claim 15, further comprising:
(E) precharging a first and a second output terminals of the buffer circuit during the precharge operation; and
(F) latching the differential voltage on the first and second nodes after step (D).

19. The method of claim 18 wherein:
the integrated circuit comprises a power supply terminal for receiving the power supply voltage and a reference terminal for receiving a reference voltage,
step (D) is carried out by an input circuit comprising a pair of transistors each of which is connected between the reference terminal and one of a third and a fourth nodes,
step (A) is carried out be a sense enable circuit comprising a pair of transistors each of which is connected between one of the first and second nodes and one of the third and fourth nodes,
step (C) is carried out by an equalization circuit comprising a transistor connected between the first and second nodes,
step (F) is carried out by a latch circuit comprising a pair of cross coupled inverters each of which is connected between the power supply terminal and one of the first and second nodes, the latch circuit providing output signals on the first and second output terminals, and step (E) is carried out by a precharge circuit comprising first, a second, and a third transistors, the first transistor being connected between the first and second output terminals and each of the second and third transistors being connected between the power supply terminal and one of the first and second output terminals.

20. The method of claim 19 wherein:

the pair of transistors in the input circuit and the pair of transistors in the sense enable cirsuit are NMOS transistors, the first, second, and third transistors in the precharge circuit and the transistor in the equalization circuit are PMOS transistors, and the pair of inverters in the latch circuit are CMOS inverters.

21. The method of claim 15 wherein step (D) is carried out by comparing the logic signal with a reference voltage.

22. The method of claim 21 wherein the logic signal is a TTL high voltage level or a TTL low voltage level, and the reference voltage is between the TTL high and low voltage levels.

23. The method of claim 22 wherein the method is used in a Dynamic Random Access Memory (DRAM) and the logic signal is an address signal.

24. The method of claim 11 wherein the supply voltage is a positive supply voltage.

25. The method of claim 10 wherein the node voltage at said only one of the first and second nodes is caused to be within the predetermined range relative to the power supply voltage by a change in the power supply voltage.

26. The method of claim 12 wherein if prior to the precharge operation the node voltage at only one of the first and second is at one threshold voltage below the supply voltage and the power supply voltage drops so that the NMOS transistor corresponding to said only one of the first and second nodes turns off, then the first and second nodes can not be charged to equal voltages during the precharge operation.

27. The method of claim 10 wherein the buffer circuit converts the logic signal to supply levels used inside the integrated circuit.

28. The method of claim 10 wherein the buffer circuit converts TTL voltage levels to CMOS voltage levels.

* * * * *

UNITED STATES PATENT AND TRADEMARK OFFICE
CERTIFICATE OF CORRECTION

PATENT NO. : 5,841,718
ISSUE DATE : 11/24/98
INVENTOR(S) : Watters, Lynne; Fang, Sharlin; Young, Pochung It is certified that error appears in the above-identified patent and that said Letters Patent is hereby corrected as shown below:

Column 9, line 11: Delete "cirsuit" and insert --circuit--.

Signed and Sealed this

Fifth Day of September, 2000

Attest:

Attesting Officer

Q. TODD DICKINSON

Director of Patents and Trademarks